US012338711B2

United States Patent
Smaadal et al.

(10) Patent No.: US 12,338,711 B2
(45) Date of Patent: Jun. 24, 2025

(54) SUBSEA CLOSED LOOP COOLING SYSTEM

(71) Applicant: VETCO GRAY SCANDINAVIA AS, Nailsea (GB)

(72) Inventors: Martin Smaadal, Hovik (NO); Ashish Jain, Hovik (NO)

(73) Assignee: VETCO GRAY SCANDINAVIA AS, Bristol (GB)

(*) Notice: Subject to any disclaimer, the term of this patent is extended or adjusted under 35 U.S.C. 154(b) by 0 days.

(21) Appl. No.: 17/995,897

(22) PCT Filed: Apr. 8, 2021

(86) PCT No.: PCT/EP2021/025130
§ 371 (c)(1),
(2) Date: Oct. 10, 2022

(87) PCT Pub. No.: WO2021/209171
PCT Pub. Date: Oct. 21, 2021

(65) Prior Publication Data
US 2023/0184059 A1  Jun. 15, 2023

(30) Foreign Application Priority Data

Apr. 15, 2020 (NO) .................................. 20200457

(51) Int. Cl.
*E21B 36/00* (2006.01)
*F04D 13/08* (2006.01)
(Continued)

(52) U.S. Cl.
CPC .......... *E21B 36/001* (2013.01); *F04D 13/086* (2013.01); *F04D 29/5813* (2013.01); *F28D 1/022* (2013.01); *H05K 7/14337* (2022.08)

(58) Field of Classification Search
CPC .. E21B 36/001; F04D 13/086; F04D 29/5813; F28D 1/022; H05K 7/14337
See application file for complete search history.

(56) References Cited

U.S. PATENT DOCUMENTS 8,978,769 B2 * 3/2015 Moore ..................... F28D 1/022
166/344
9,386,729 B2 * 7/2016 Baerd ................ H05K 7/20927
(Continued)

FOREIGN PATENT DOCUMENTS

CN       1203654 A    12/1998
CN     102428249 A     4/2012
(Continued)

OTHER PUBLICATIONS

First Office Action issued in corresponding Chinese Patent Application No. 202180028901.X, dated Mar. 29, 2025 (w-English translation).

*Primary Examiner* — Matthew R Buck
(74) *Attorney, Agent, or Firm* — Hogan Lovells US LLP

(57) ABSTRACT

The present invention relates to a closed loop subsea cooling system with a subsea cooler. A coolant pump assembly is located in a dedicated, sealed, gas filled, coolant pump housing in coolant fluid connection with the at least one subsea cooler. A heat sink in a dedicated sealed, gas filled, electronics housing is in coolant fluid connection with the subsea cooler. An accumulator is in coolant fluid connection with the subsea cooler, whereby the electric coolant pump is adapted to pump coolant through the at least one subsea cooler, the at least one heat sink and back to the at least one electric coolant pump assembly, forming a closed loop subsea cooling circuit.

11 Claims, 6 Drawing Sheets

(51) Int. Cl.
      *F04D 29/58*       (2006.01)
      *F28D 1/02*        (2006.01)
      *H05K 7/14*        (2006.01)

(56) References Cited

U.S. PATENT DOCUMENTS

| | | | | |
|---|---|---|---|---|
| 9,964,113 | B2 * | 5/2018 | Westberg | F04D 13/023 |
| 11,419,241 | B2 * | 8/2022 | Laneryd | F28F 1/40 |
| 11,448,473 | B2 * | 9/2022 | Laneryd | F28F 9/26 |
| 2019/0072096 | A1 | 3/2019 | Mei et al. | |
| 2020/0347690 | A1 * | 11/2020 | Landa | F16K 31/047 |
| 2022/0307489 | A1 * | 9/2022 | Westberg | F04B 49/02 |

FOREIGN PATENT DOCUMENTS

| | | | | |
|---|---|---|---|---|
| CN | 103843241 | A | 6/2014 | |
| CN | 106165558 | A | 11/2016 | |
| EP | 2579438 | A1 | 4/2013 | |
| EP | 2 679 765 | A1 | 1/2014 | |
| EP | 2928275 | A1 | 10/2015 | |
| EP | 3051243 | A1 * | 8/2016 | |
| WO | WO-2014001383 | A1 * | 1/2014 | ........... E21B 36/001 |

\* cited by examiner

SUBSEA CLOSED LOOP COOLING SYSTEM

The present invention relates to a subsea closed loop cooling system.

Traditional subsea shell and tube heat exchangers does not allow cooling of electronics/equipment, only fluids. Using seawater as cooling medium introduces risk of scaling and clogging and is thus unsuited for cooling electronics and for use in narrow ducts.

The present invention provides a subsea closed loop cooling system for cooling electronics using glycol/water-based fluids at low pressure (not compensated to ambient seawater). The system typically comprises a topside type centrifugal pump housed inside an atmospheric canister, natural convection coolers, an accumulator, distribution piping and heat sinks for cooling electric and electronic circuits. The closed loop system enables a wide range of fluids to be used while operating pressures can be independent on water depth. Furthermore, a closed system eliminates problems with internal scaling and contamination while anti-freeze and corrosion inhibitors can be maintained in the system. Locating the coolant pump in a canister with atmospheric pressure enables a topside type coolant pump to be used in a protected environment.

The cooling system is modular, and one coolant pump can distribute the coolant into multiple heat sinks and multiple coolers. The heat sinks and coolers can be arranged in series and/or parallel, to optimize various system aspects such as coolant pump differential pressure and flow, sizing of coolers, operating pressure, etc.

The present invention concerns a subsea cooling system with a closed loop cooling circuit. The closed loop subsea cooling system includes at least one subsea cooler, at least one electric coolant pump assembly in a dedicated sealed, gas filled, coolant pump housing, at least one heat sink in a dedicated sealed, gas filled, electronics housing in the closed loop cooling circuit, at least one coolant volume compensation unit in the closed loop cooling circuit whereby the at least one electric coolant pump assembly is adapted to pump coolant at least through the at least one subsea cooler, the at least one heat sink and back to the at least one electric coolant pump assembly.

The at least one coolant volume compensation unit compensates for the variations in the volume of the fluid circuit and for variations of the volume of the fluid typically due to temperature fluctuations. The circuit is closed, and no compensation is performed in view of the pressure externally of the closed circuit.

The pressure in the closed loop subsea cooling circuit may typically be below 1000 kPa. There will be some pressure differences through the cooling circuit due to flow resistance. There will also be some insignificant pressure differences due to hydrostatic pressure differences through the circuit.

The pressure in the dedicated sealed, gas filled, coolant pump housing and in the at least one dedicated sealed, gas filled, electronics housing may typically be in a range between 50 kPa and 150 kPa.

The at least one subsea cooler, the at least one electric coolant pump assembly, and the at least one heat sink of the closed loop subsea cooling circuit are located at substantially one level, and are rated to less than 1000 kPa.

The closed loop subsea cooling system may include a plurality of heat sinks, each in a dedicated sealed, gas filled, electronics housing. Each sealed electronics housing may include several heat sinks, connected in parallel or series.

The closed loop subsea cooling system may include a plurality of subsea coolers.

The closed loop subsea cooling system may include a plurality of subsea coolers, and the number of subsea coolers is only limited by practical concerns.

The closed loop subsea cooling system may include a plurality of heat sinks each in a in dedicated sealed, gas filled, electronics housing, connected in parallel, and the number of heat sinks is only limited by practical concerns.

The closed loop subsea cooling system may include a plurality of heat sinks, each in a dedicated sealed, gas filled, electronics housing, connected in series, and the number of heat sinks is only limited by practical concerns.

The pump assembly and the at least one heat sink may be topside rated components.

The at least one coolant volume compensation unit may be located externally on the closed loop cooling circuit.

The at least one coolant volume compensation unit may be located internally inside at least one of the sealed housings.

The closed loop subsea cooling system may include several heat sinks in each canister and any combination of number of heat sinks and canisters in parallel or in series and the above suggested combinations are just different embodiments to explain the invention.

The pump of the pump assembly may be a centrifugal pump.

Figure 1:
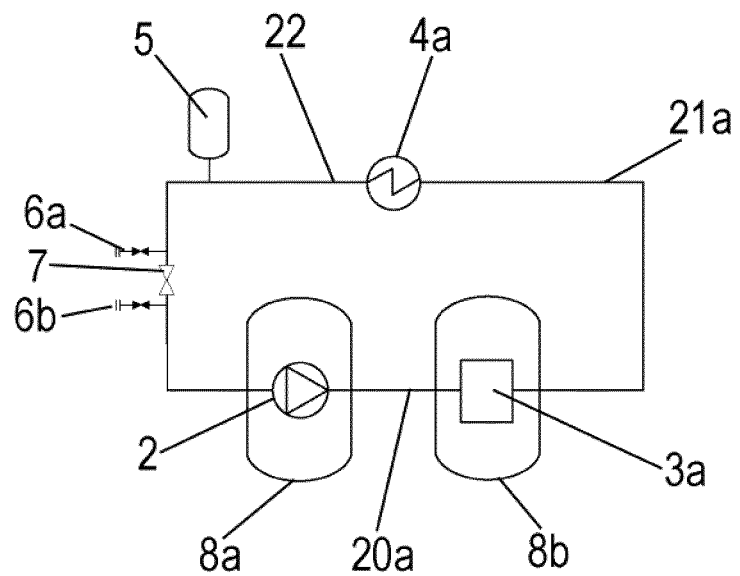
FIG. 1 is a schematic representation of a subsea closed loop cooling system of a first embodiment of the invention.

FIG. 1 shows a subsea closed loop cooling system 1 of the invention in its simplest form. The closed loop cooling system is isolated from ambient seawater pressure. The components of the system are located on approximately the same elevation to minimize the static head within the system to reduce the overall pressure rating.

A coolant pump assembly 2 requiring a non-liquid atmosphere, typically a centrifugal coolant pump for use topside, is located in a sealed coolant pump housing 8a. The coolant pump assembly 2 and the coolant pump housing 8a form a coolant pump unit. The housing 8a forms a dedicated pressure canister that protects the coolant pump assembly from the ambient conditions. The standalone coolant pump/canister assembly is exposed to the seawater and can be located independent of the heat sinks and coolers. The independent coolant pump assembly unit can be used in other applications, such as chemical injection systems, liquid draining etc.

The coolant pump assembly includes a cooling pump and an electric motor driving the coolant pump. The sealed coolant pump housing 8a typically includes a canister shell, flange and seal. The accumulator may be integral in the sealed coolant pump housing 8a.

An outlet of the coolant pump assembly is connected to an inlet of a first heat sink 3a cooling electronics in a first sealed electronics housing 8b through piping 20a. The heat sink 3a is dimensioned according to the pressure inside the closed loop, typically less than 1000 kPa and does not have to be dimensioned to withstand the ambient seawater pressure. Piping 21a connects an outlet of the first heatsink 3a to an inlet of a first subsea cooler 4a. Piping 22 connects an outlet of the first subsea cooler 4a to an inlet of the coolant pump assembly 2. A coolant volume compensation unit in the form of an accumulator 5 is connected to the piping 22 between the first heat exchanger 4a and the coolant pump assembly 2 with a T-joint to allow for variations in the volume of the closed loop, typically due to temperature variations. The piping 22 between the first heat exchanger 4a and the coolant pump assembly 2 also includes an isolation valve 7 between a vacuuming valve 6a and a filling valve 6b. The isolation valve 7 is closed when the closed loop is filled with coolant, typically a glycol and water-based fluid.

Figure 2:
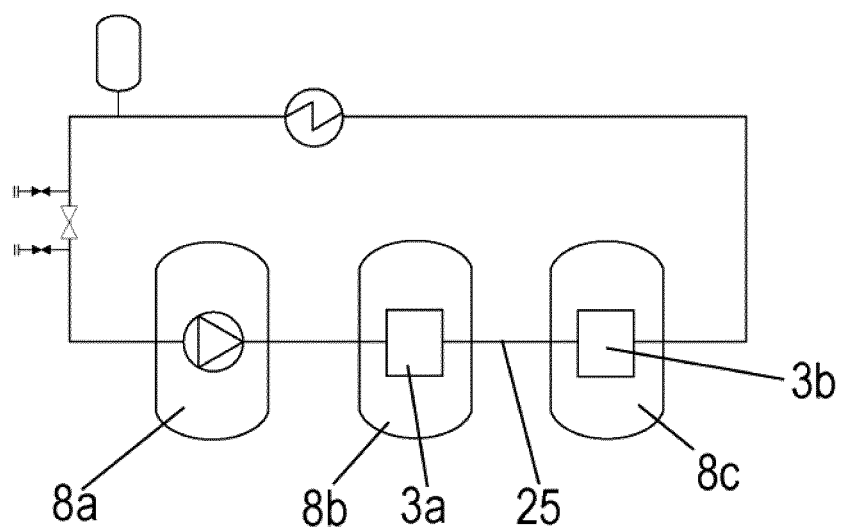
FIG. 2 is a schematic representation of a subsea closed loop cooling system of a second embodiment of the invention.

FIG. 2. shows a subsea closed loop cooling system 1 corresponding to the system of FIG. 1. In FIG. 2 the system includes a second heat sink 3b cooling electronics in a second sealed electronics housing 8c in addition to the first heatsink 3a in the first sealed electronics housing 8b. Piping 25 connects the outlet of the first heatsink 3a and the inlet of the second heat sink 3b and the first heat sink 3a and the second heat sink 3b are thus connected in series.

Figure 3:
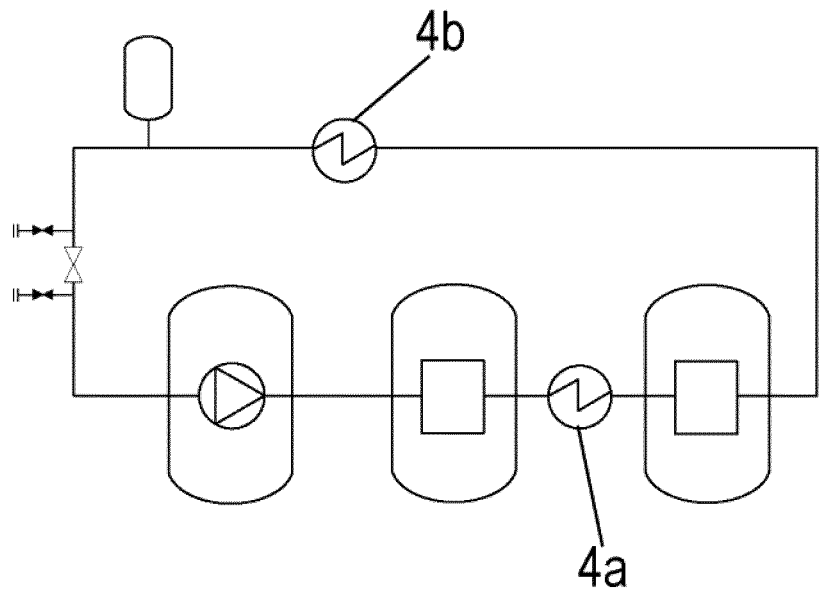
FIG. 3 is a schematic representation of a subsea closed loop cooling system of a third embodiment of the invention.

FIG. 3. shows a subsea closed loop cooling system 1 corresponding to the system of FIG. 2. In FIG. 3 however the system includes a second subsea cooler 4b between the first heat sink 3a and the second heatsink 3b along the piping 25 between the heat sinks 3a, 3b.

Figure 4:
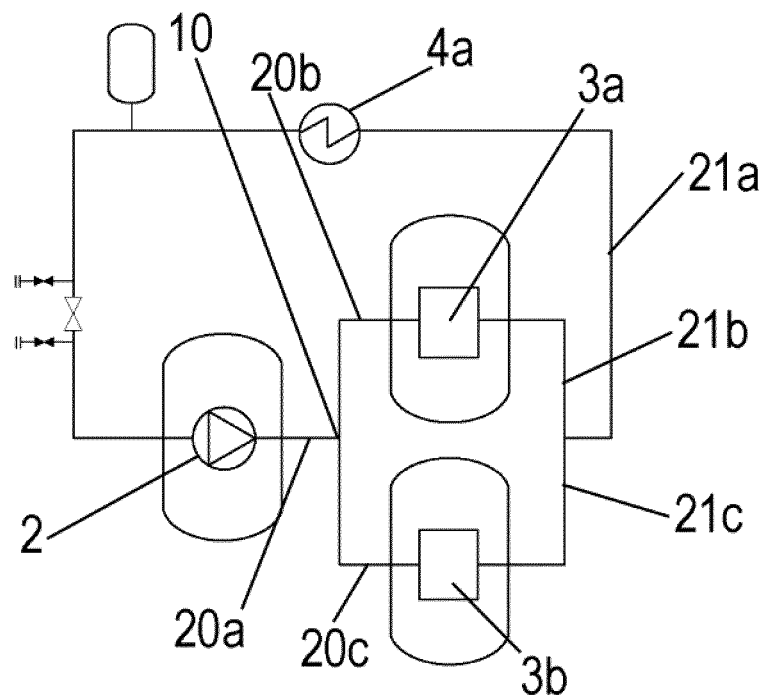
FIG. 4 is a schematic representation of a subsea closed loop cooling system of a fourth embodiment of the invention.

FIG. 4 shows a subsea closed loop cooling system 1 corresponding to the system of FIG. 2. In FIG. 4 however, the two heat sinks 3a and 3b are connected in parallel. The piping 20a from the outlet of the coolant pump assembly 2 is split into a first inlet pipe 20b to the inlet of the first heat sink 3a and to a second inlet pipe 20c to the inlet of the second heat sink 3b in an inlet header 10 formed as a T-joint. The first heat sink 3a and the second heat sink 3b are thus connected in parallel.

The flow of coolant from the outlet of the first heat sink 3a flows into a first outlet pipe 21b and the flow of coolant from the outlet of the second heat sink 3b flows into a second outlet pipe 21c. The two outlet flows are joined in a T-joint into pipe 21a and flows to the subsea cooler 4a.

Figure 5:
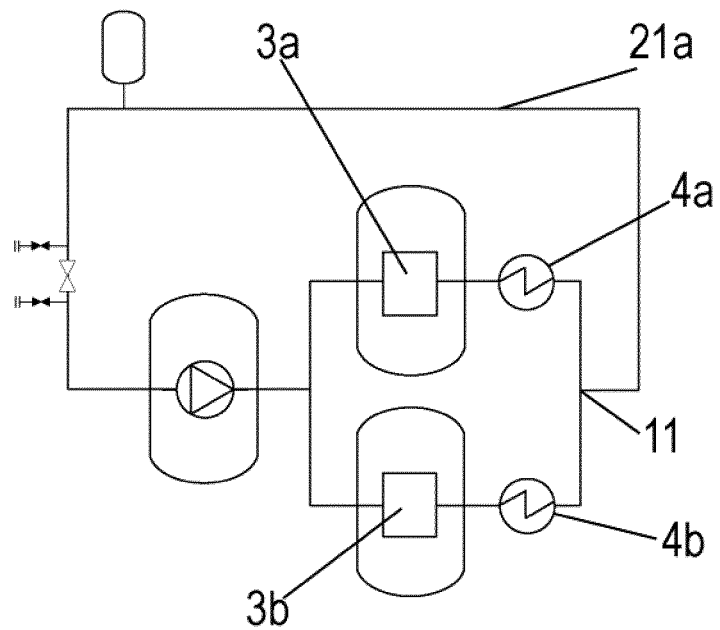
FIG. 5 is a schematic representation of a subsea closed loop cooling system of a fifth embodiment of the invention.

FIG. 5 shows a subsea closed loop cooling system 1 corresponding to the system of FIG. 4. In FIG. 5 however, a first subsea cooler 4a is connected to the outlet of the first heat sink 3a and a second subsea cooler 4b is connected to the outlet of the second heat sink 3b before the two outlet flows are joined in the outlet header 11 formed as a T-joint into pipe 21a and flows to the subsea cooler 4a.

Figure 6:
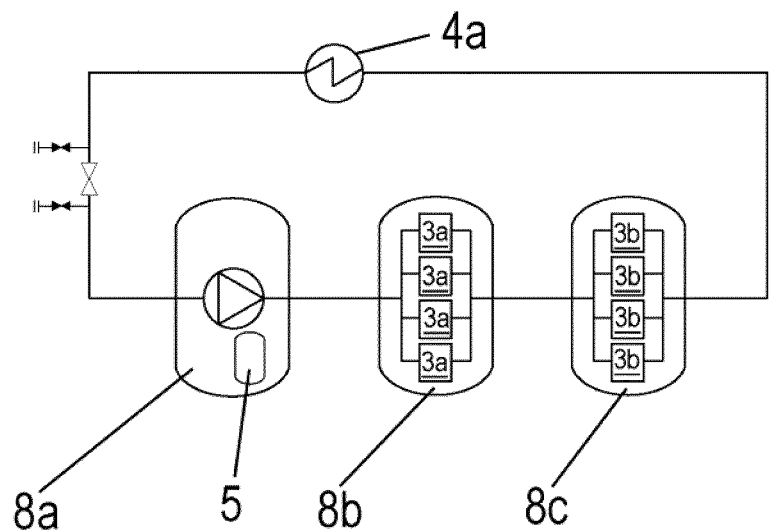
FIG. 6 is a schematic representation of a subsea closed loop cooling system of a sixth embodiment of the invention.

FIG. 6. shows a subsea closed loop cooling system 1 corresponding to the system of FIG. 2. In FIG. 6 the system includes a plurality of heat sinks 3a in parallel in the first sealed electronics housing 8b, and a plurality of heat sinks 3b in parallel in the second sealed electronics housing 8c. Additionally, the accumulator 5 is integrated in the gas filled sealed coolant pump housing 8a.

The accumulator 5 could be integrated in any of the sealed housings 8a-8d.

Figure 7:
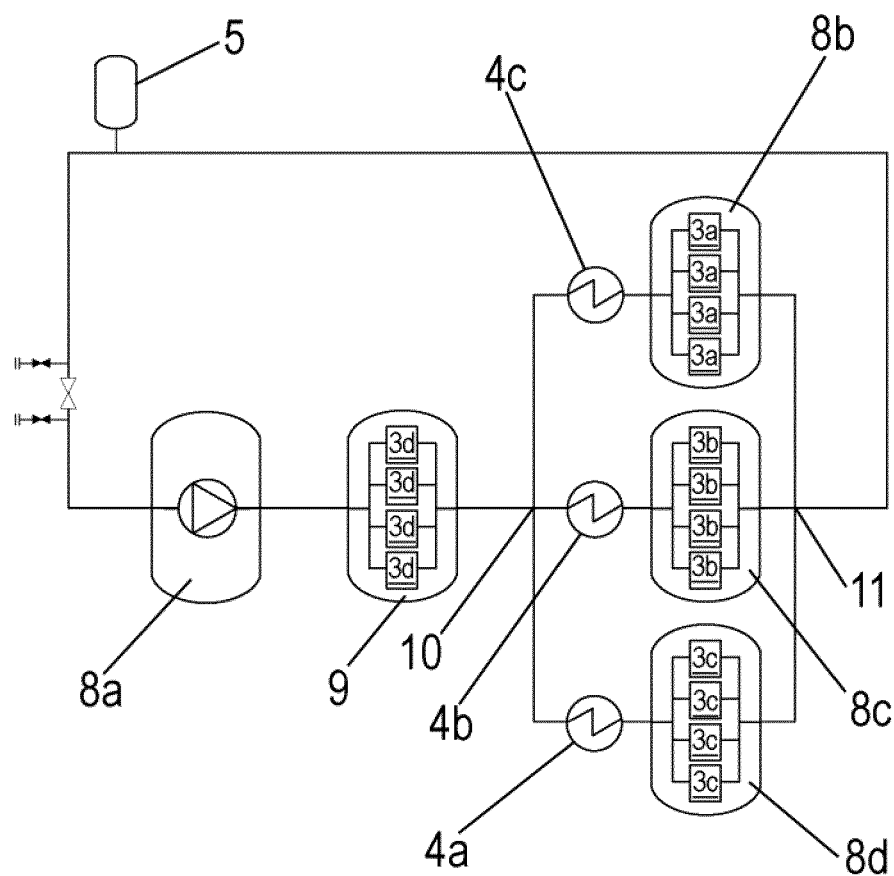
FIG. 7 is a schematic representation of a subsea closed loop cooling system of a seventh embodiment of the invention.

FIG. 7 is a schematic representation of the subsea closed loop cooling system 1 in a typical subsea configuration. The coolant pump assembly in the gas filled sealed coolant pump housing 8a pumps coolant to a Modular Compact Pump (MCP) 9 to be cooled by a plurality of heat sinks 3d and from the MCP 9 to an inlet header 10 splitting the pipe with coolant to three branches, one for each of three sealed electronic housings containing Variable Speed Drives (VSD) 8b, 8c, 8d. The first sealed electronic housings 8b, includes a plurality of first heat sinks 3a in parallel, the second sealed electronic housings 8c includes a plurality of second heat sinks 3b in parallel and the third sealed electronic housings 8d includes a plurality of third heat sinks 3c in parallel.

A subsea cooler is 4a, 4b, 4c is connected in the pipes between the inlet header 10 and each of the of three sealed electronics housings 8b, 8c, 8d. An outlet header 11 connects the outlet pipes from each of the three sealed electronics housings 8b, 8c, 8d into one pipe that returns to the pump assembly in the sealed coolant pump housing 8a. The accumulator 5 is provided to accommodate small changes of the volume in the closed loop system.

Figure 8:
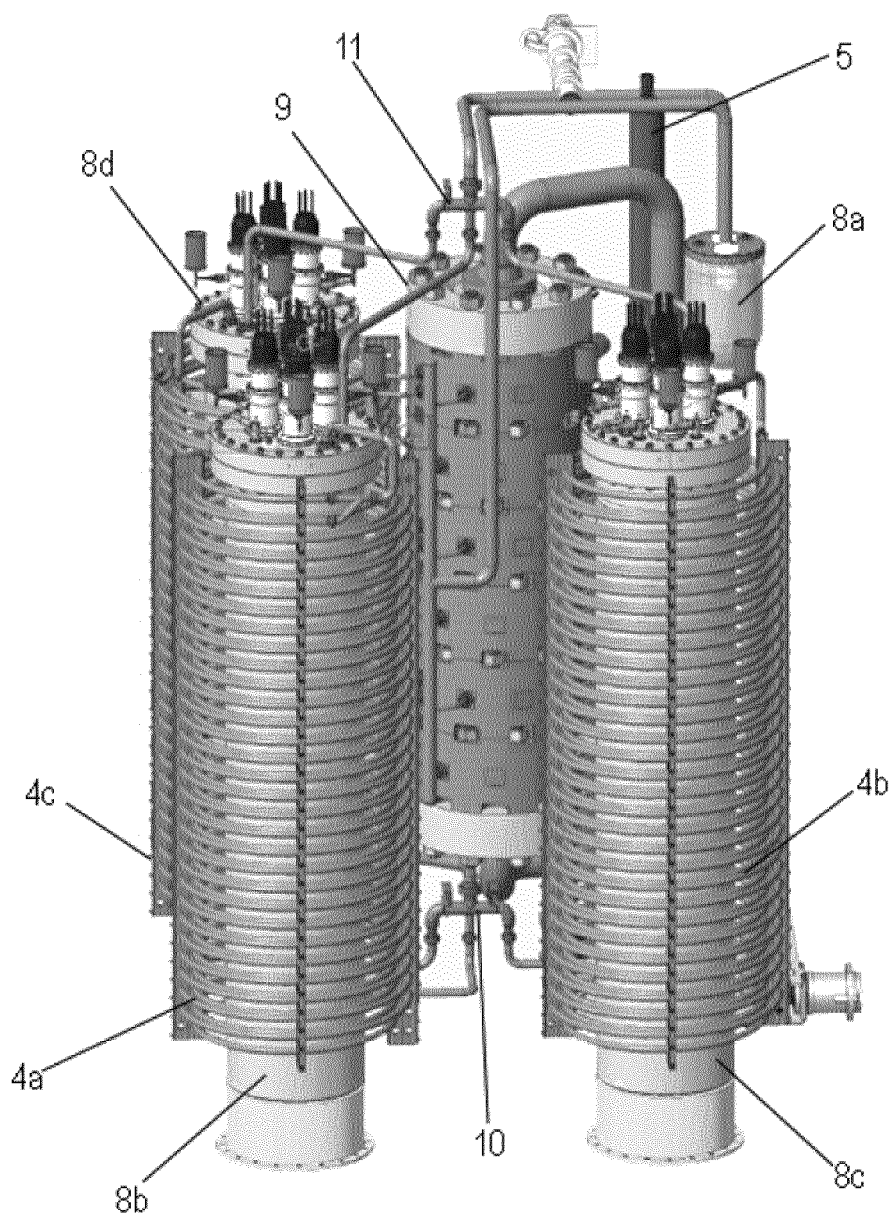
FIG. 8 is a perspective view of a typical layout of the sixth embodiment of the invention.

FIG. 8 shows an actual layout of the subsea closed loop cooling system 1 shown in FIG. 6. Each of the three VSD's in the three sealed electronics housings 8b, 8c, 8d are surrounded by pipe coils forming subsea coolers 4a, 4b, 4c. The inlet header 10 is located below the MCP 9 and the outlet header 11 is located above the MCP 9. The coolant volume compensation unit is an accumulator 5 located externally on the cooling circuit and is thus not located inside any of the sealed housings.

Figure 9:
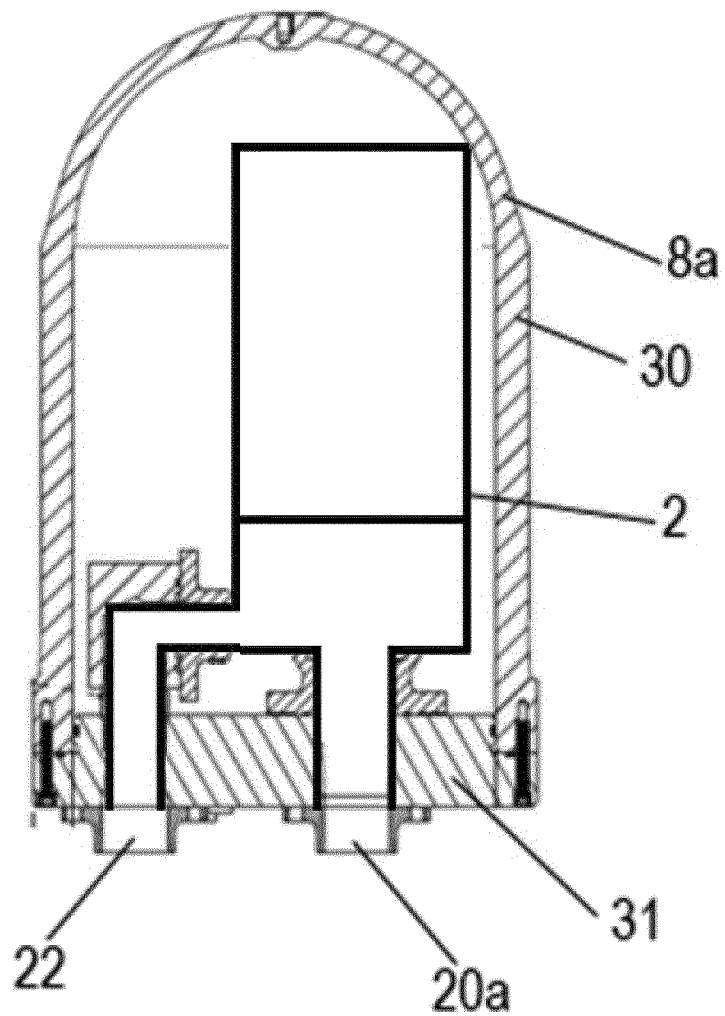
FIG. 9 is a cross-section of a typical coolant pump assembly in a coolant pump housing.

FIG. 9 is a typical cross-section of a sealed coolant pump housing 8a with pump assembly 2 including an electric motor and a centrifugal pump. Piping 20a provides an inlet of the coolant pump assembly. Piping 22 provides an outlet of the coolant pump assembly 2. The sealed coolant pump housing 8a is formed as a sealed canister with a bell-shaped portion 30 and a lid portion 31 closing the bell-shaped portion 30. The inner volume of the sealed canister is gas filled and is typically filled with an inert and stable gas to provide a dry and non-corrosive environment.

The cooling system is modular in that one coolant pump assembly can distribute the coolant into multiple heat sinks and multiple coolers. The heat sinks and coolers can be arranged in series and/or parallel, to optimize various system aspects such as coolant pump differential pressure and flow, sizing of coolers, operating pressure, etc.

The invention claimed is:

1. A closed loop subsea cooling system with a closed loop cooling circuit comprising:
    at least one subsea cooler in the closed loop cooling circuit;
    at least one topside rated electric coolant pump assembly in a dedicated sealed, gas filled, coolant pump housing in the closed loop cooling circuit;
    at least one heat sink in a dedicated sealed, gas filled, electronics housing in the closed loop cooling circuit with an operating pressure independent of water depth; and,
    at least one coolant volume compensation unit in the closed loop cooling circuit;
    whereby the at least one electric coolant pump assembly is adapted to pump coolant at least through the at least one subsea cooler, the at least one heat sink and back to the at least one electric coolant pump assembly,
    wherein the pressure in the dedicated sealed, gas filled, coolant pump housing and in the at least on dedicated sealed, gas filled, electronics housing is in a range between 50 kPa and 150 kPa.

2. The closed loop subsea cooling system of claim 1, wherein the pressure in the closed loop subsea cooling system is less than 1000 kPa.

3. The closed loop subsea cooling system of claim 1 wherein the least one subsea cooler, the at least one electric coolant pump assembly, and the at least one heat sink of the closed loop subsea cooling circuit are located at substantially one level, and are rated to less than 1000 kPa.

4. The closed loop subsea cooling system of claim 1, including a plurality of heat sinks each in a dedicated sealed, gas filled, electronics housing.

5. The closed loop subsea cooling system of claim 1, including a plurality of subsea coolers.

6. The closed loop subsea cooling system of claim 1, including a plurality of heat sinks each in a dedicated sealed, gas filled, electronics housing, connected in parallel.

7. The closed loop subsea cooling system of claim 1, including a plurality of heat sinks, each in a dedicated sealed, gas filled, electronics housing, connected in series.

8. The closed loop subsea cooling system of claim 1, wherein the pump assembly and the at least one heat sink are topside rated components.

9. The closed loop subsea cooling system of claim 1, wherein a pump of the pump assembly is a centrifugal pump.

10. The closed loop subsea cooling system of claim 1, wherein the at least one coolant volume compensation unit is located externally on the closed loop cooling circuit.

11. The closed loop subsea cooling system of claim 1, wherein the at least one coolant volume compensation unit is located internally inside at least one of the sealed pump housing and the sealed electronics housing.

* * * * *